US012581874B2

(12) United States Patent
Cheng et al.

(10) Patent No.: US 12,581,874 B2
(45) Date of Patent: Mar. 17, 2026

(54) EPITAXIAL SUBSTRATE HAVING A PROTECTIVE EDGE LAYER AND MANUFACTURING METHOD THEREFOR

(71) Applicant: ENKRIS SEMICONDUCTOR, INC., Suzhou (CN)

(72) Inventors: Kai Cheng, Suzhou (CN); Peng Xiang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 421 days.

(21) Appl. No.: 18/250,535

(22) PCT Filed: Nov. 13, 2020

(86) PCT No.: PCT/CN2020/128770
§ 371 (c)(1),
(2) Date: Apr. 25, 2023

(87) PCT Pub. No.: WO2022/099635
PCT Pub. Date: May 19, 2022

(65) Prior Publication Data
US 2023/0402282 A1 Dec. 14, 2023

(51) Int. Cl.
*H01L 21/02* (2006.01)
*C30B 25/18* (2006.01)
(Continued)

(52) U.S. Cl.
CPC .......... *H10P 14/3416* (2026.01); *C30B 25/18* (2013.01); *C30B 29/403* (2013.01); *H10P 14/2905* (2026.01); *H10P 14/2926* (2026.01)

(58) Field of Classification Search
CPC ........... H01L 21/0254; H01L 21/02381; H01L 21/02433; C30B 25/18; C30B 25/186
See application file for complete search history.

(56) References Cited

U.S. PATENT DOCUMENTS 9,245,736 B2 1/2016 Ziad et al.
9,842,899 B2 12/2017 Ziad et al.
(Continued)

FOREIGN PATENT DOCUMENTS

CN 103187250 7/2013
CN 104051504 A 9/2014
(Continued)

OTHER PUBLICATIONS

ISA State Intellectual Property Office of the People's Republic of China, International Search Report Issued in Application No. PCT/CN2020/128770, Aug. 12, 2021, WIPO, 6 pages.
(Continued)

*Primary Examiner* — Davienne N Monbleau
*Assistant Examiner* — Emily Farmer
(74) *Attorney, Agent, or Firm* — Carroll, Hoette & Butscher, LLC; Christopher R. Carroll

(57) ABSTRACT

The present application provides a substrate and a manufacturing method therefor. The substrate includes a silicon substrate and a protective layer, the silicon substrate includes a middle part and an edge part, and a thickness of the middle part is greater than a thickness of the edge part. The middle part has a to-be-grown surface, and a crystal orientation of the to-be-grown surface is different from a crystal orientation of surface of the edge part. The protective layer covers the edge part and is configured to prevent defects in the edge part from extending to the middle part during high-temperature processing.

15 Claims, 6 Drawing Sheets

(51) Int. Cl.
  C30B 29/40 (2006.01)
  H10P 14/20 (2026.01)

(56) References Cited

U.S. PATENT DOCUMENTS

| | | | |
|---|---|---|---|
| 10,546,748 B2 | 1/2020 | Yu et al. | |
| 2012/0034768 A1 | 2/2012 | Sato | |
| 2013/0087807 A1* | 4/2013 | Ikuta | C30B 25/18 |
| | | | 257/76 |
| 2014/0264368 A1 | 9/2014 | Ziad et al. | |
| 2015/0001682 A1* | 1/2015 | Liu | H01L 23/562 |
| | | | 438/763 |
| 2016/0099319 A1 | 4/2016 | Ziad et al. | |
| 2018/0240667 A1* | 8/2018 | Yu | H01L 21/32136 |

| | | | |
|---|---|---|---|
| 2019/0067081 A1 | 2/2019 | Gardner et al. | |
| 2020/0064670 A1 | 2/2020 | Chiu et al. | |
| 2020/0083044 A1 | 3/2020 | Yu et al. | |

FOREIGN PATENT DOCUMENTS

| | | | | |
|---|---|---|---|---|
| CN | 104835720 A | * | 8/2015 | ....... H01L 21/02087 |
| CN | 110520963 A | | 11/2019 | |
| CN | 110858034 A | | 3/2020 | |

OTHER PUBLICATIONS

ISA State Intellectual Property Office of the People's Republic of China, Written Opinion of the International Searching Authority Issued in Application No. PCT/CN2020/128770, Aug. 12, 2021, WIPO, 6 pages. (Submitted with Machine Partial Translation).

* cited by examiner

Provide a silicon substrate including a middle part and an edge part, where a thickness of the middle part is greater than a thickness of the edge part, the middle part has a to-be-grown surface, and a crystal orientation of the to-be-grown surface is different from a crystal orientation of surface of the edge part; form a covering layer on the edge part — S1

Polish the covering layer to expose the to-be-grown surface and retain the covering layer on the edge part to form a protective layer — S2

FIG. 1

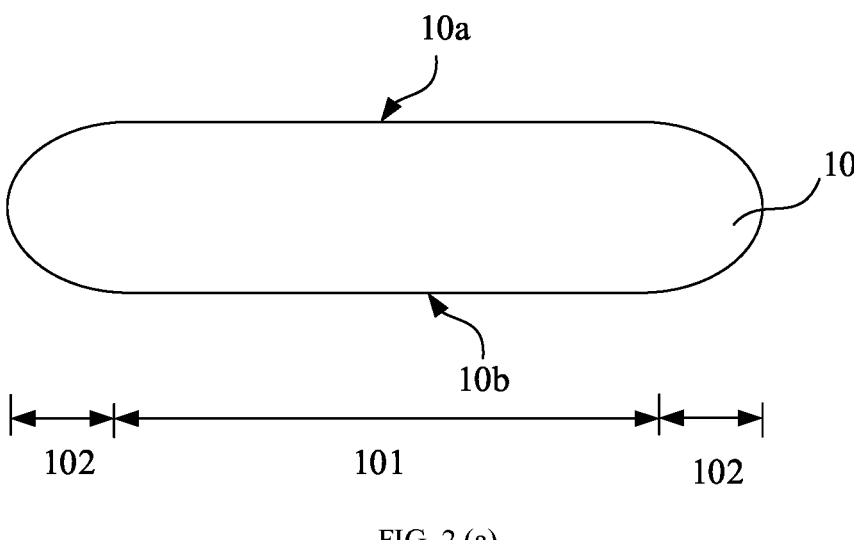

EPITAXIAL SUBSTRATE HAVING A PROTECTIVE EDGE LAYER AND MANUFACTURING METHOD THEREFOR

CROSS REFERENCE TO RELATED APPLICATIONS

This application is a US National Phase of a PCT Application No. PCT/CN2020/128770 filed on Nov. 13, 2020, the entire contents of which are incorporated herein by reference in their entireties.

TECHNICAL FIELD

The present application relates to the field of semiconductor technologies, and in particular, to a substrate and a manufacturing method therefor.

BACKGROUND

As typical representatives of a third generation of semiconductor materials, wide bandgap semiconductor materials, III-V compounds, have excellent characteristics of wide bandgap, high-pressure resistance, high-temperature resistance, high electron saturation and drift velocity, and easiness to form high-quality heterostructure, and are very suitable for manufacturing high-temperature, high-frequency and high-power electronic devices.

III-V compound materials can be formed on a silicon substrate through epitaxial growth. In practical products, the III-V compound materials epitaxially grown on the silicon substrate are easy to produce various defects, such as meltback, cracks, particles and pits, resulting in poor quality.

SUMMARY

A purpose of the present disclosure is to provide a substrate and a manufacturing method therefor to improve the quality of III-V compound materials epitaxially grown on the substrate.

In order to achieve the above purpose, in a first aspect of the present disclosure, a method for manufacturing a substrate is provided, including:

providing a silicon substrate including a middle part and an edge part, where a thickness of the middle part is greater than a thickness of the edge part; the middle part has a to-be-grown surface, and a crystal orientation of the to-be-grown surface is different from a crystal orientation of surfaces of the edge part; forming a covering layer on the edge part, where the covering layer is a protective layer.

Optionally, the covering layer is further formed on the to-be-grown surface and/or a rear surface of the silicon substrate; the covering layer is polished to expose the to-be-grown surface, such that the covering layer on the edge part is retained to form the protective layer.

Optionally, the covering layer is formed through thermal oxidation of the silicon substrate.

Optionally, the covering layer is formed through deposition including: physical vapor deposition, chemical vapor deposition, plasma enhanced chemical vapor deposition, low pressure chemical vapor deposition or atomic layer deposition.

Optionally, the covering layer is polished to further expose the rear surface of the silicon substrate.

Optionally, a material for the covering layer includes at least one of silicon dioxide, silicon nitride, aluminum oxide, silicon carbide, silicon oxynitride or aluminum oxynitride.

Optionally, the covering layer is formed through local thermal oxidation.

Optionally, the covering layer has a single-layer structure.

Optionally, on a vertical section of the silicon substrate, a side surface of the edge part is convex arc-shaped, step-shaped, trapezoidal, right angled, acute angled or obtuse angled.

Optionally, the crystal orientation of the to-be-grown surface is [111], and the crystal orientation of the surface of the edge part is [110].

In a second aspect of the present disclosure, a substrate is provided, and the substrate includes a silicon substrate and a protective layer.

The silicon substrate including a middle part and an edge part, where a thickness of the middle part is greater than a thickness of the edge part; the middle part has a to-be-grown surface, and a crystal orientation of the to-be-grown surface is different from a crystal orientation of surface of the edge part.

The protective layer covering the edge part and configured to prevent defects in the edge part from extending to the middle part during high-temperature processing.

Optionally, a material for the protective layer includes at least one of silicon dioxide, silicon nitride, aluminum oxide, silicon carbide, silicon oxynitride or aluminum oxynitride.

Optionally, the protective layer has a single-layer structure.

Optionally, on a vertical section of the silicon substrate, a side surface of the edge part is convex arc-shaped, step-shaped, trapezoidal, right angled, acute angled or obtuse angled.

Optionally, the crystal orientation of the to-be-grown surface is [111], and the crystal orientation of the surface of the edge part is [110].

BRIEF DESCRIPTION OF THE DRAWINGS

FIG. 1 is a flowchart illustrating a method for manufacturing a substrate according to a first embodiment of the present disclosure.

Figure 2:
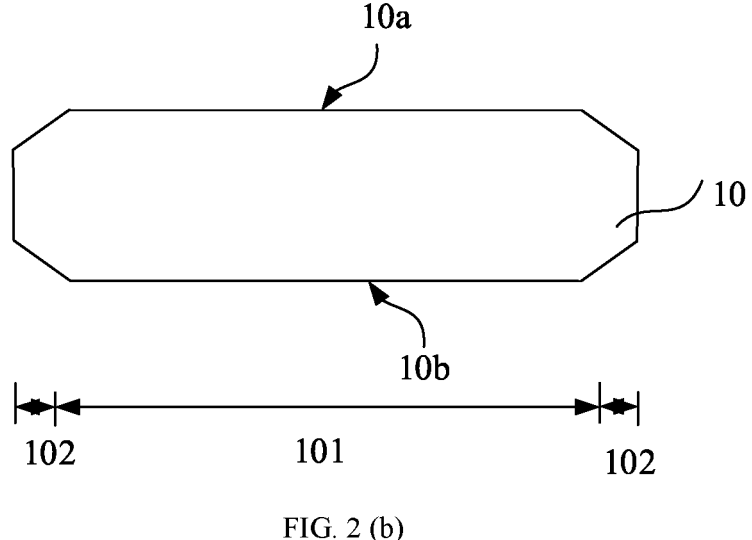
FIGS. 2 (a) to 4 are schematic diagrams illustrating intermediate structures corresponding to processes in FIG. 1.
Figure 2:
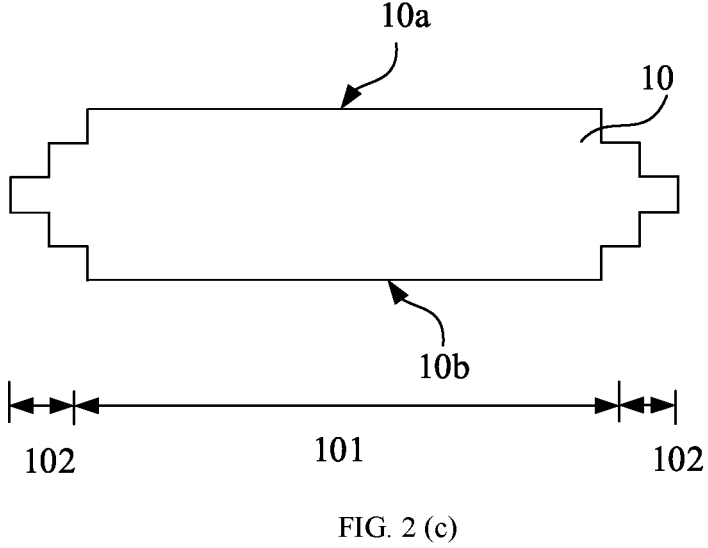
Figure 2:
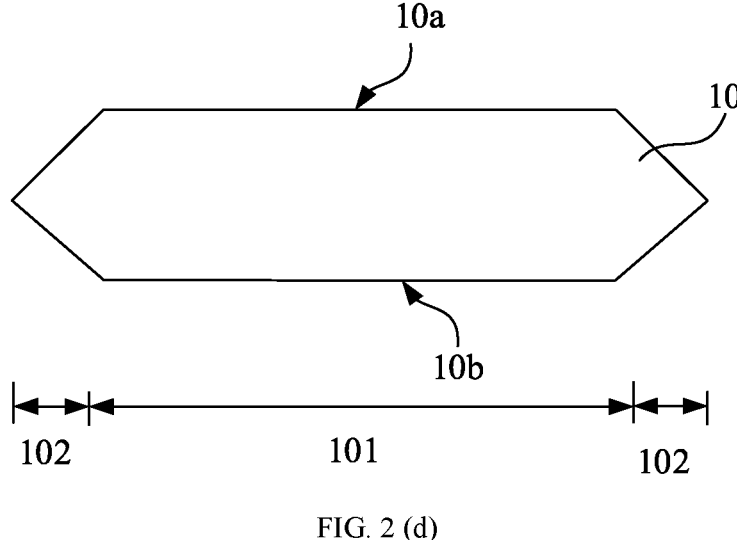

In order to facilitate the understanding of the present disclosure, all reference signs appearing in the present disclosure are listed below:

Silicon substrate 10
Middle part 101
Edge part 102
To-be-grown surface 10a

Rear surface 10b
Protective layer 11
Covering layer 12

DETAILED DESCRIPTION OF THE EMBODIMENTS

In order to make the purposes, features and advantages of the present disclosure more apparent and understandable, the specific embodiments of the present disclosure will be described in detail below with reference to the accompanying drawings.

FIG. 1 is a flowchart illustrating a method for manufacturing a substrate according to a first embodiment of the present disclosure. FIGS. 2 (a) to 4 are schematic diagrams illustrating intermediate structures corresponding to processes in FIG. 1.

Figure 3:
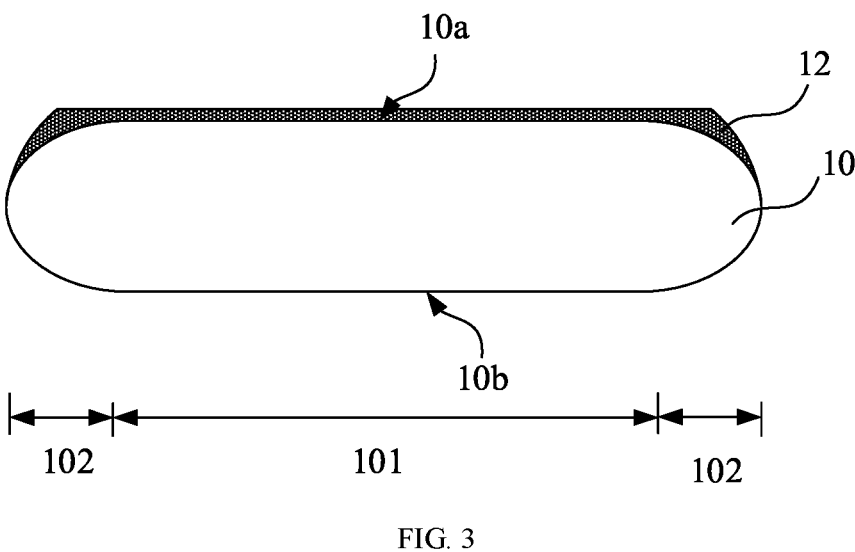

First, with reference to step S1 in FIG. 1 and FIGS. 2 (a) to 2 (d), a silicon substrate is provided, and the silicon substrate 10 includes a middle part 101 and an edge part 102. A thickness of the middle part 101 is greater than a thickness of the edge part 102. The middle part 101 has a to-be-grown surface 10a. A crystal orientation of the to-be-grown surface 10a is different from a crystal orientation of surface of the edge part 102. As shown in FIG. 3, a covering layer 12 is formed on the to-be-grown surface 10a and the edge part 102.

With reference to FIGS. 2 (a) to 2 (d), a material for the silicon substrate 10 is single crystal silicon, and the to-be-grown surface 10a and a rear surface 10b that are opposite to each other are included. The to-be-grown surface 10a is used for epitaxial growth of III-V compound materials.

The thickness of the middle part 101 of the silicon substrate 10 is approximately uniform. The thicknesses of the edge part 102 is less than the thickness of the middle part 101. On a vertical section of the silicon substrate 10, a side surface of the edge part 102 may take various shapes. For example, as shown in FIG. 2 (a), the side surface of the edge part 102 is arc-shaped and convex; or as shown in FIG. 2 (b), the side surface of the edge part 102 is trapezoidal; or as shown in FIG. 2 (c), the side surface of the edge part 102 is step-shaped; or as shown in FIG. 2 (d), the side surface of the edge part 102 is a sharp angle. The sharp angle in FIG. 2 (d) may be right angle, acute angle or obtuse angle. In other embodiments, the side surface of the edge part 102 may be a slope surface. The shape of the side surface of the edge part 102 is not limited in this embodiment.

Subsequent steps will be continuously introduced below with the shape of the silicon substrate 10 shown in FIG. 2 (a).

The crystal orientation of the to-be-grown surface 10a may be [111], and the crystal orientation of the surface of the edge part 102 may be [110].

A material for the covering layer 12 may include at least one of silicon dioxide, silicon nitride, aluminum oxide, silicon carbide, silicon oxynitride or aluminum oxynitride. Correspondingly, the covering layer 12 is formed through physical vapor deposition (PVD), chemical vapor deposition (CVD), plasma enhanced chemical vapor deposition (PECVD), low pressure chemical vapor deposition (LPCVD) or atomic layer deposition (ALD).

With reference to FIG. 3, in this embodiment, the covering layer 12 has a single-layer structure. In other embodiments, the covering layer 12 may have a laminated structure. Compared with the laminated structure, the single-layer structure may not have a mismatch problem of thermal expansion coefficients of materials, and can reduce the cost.

Figure 4:
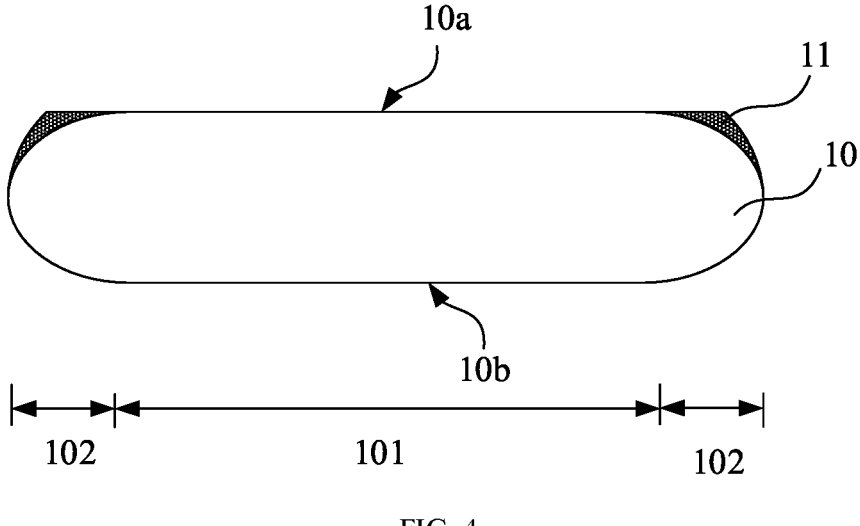

Next, with reference to step S2 in FIG. 1 and FIG. 4, the covering layer 12 is polished to expose the to-be-grown surface 10a, such that the covering layer 12 on the edge part 102 is retained to form a protective layer 11.

Polishing the covering layer 12 may be implemented through chemical mechanical polishing (CMP).

With reference to FIG. 4, the substrate in this embodiment includes a silicon substrate and a protective layer 11.

The silicon substrate 10 includes the middle part 101 and the edge part 102. The thickness of the middle part 101 is greater than the thickness of the edge part 102. The middle part 101 has the to-be-grown surface 10a, and the crystal orientation of the to-be-grown surface 10a is different from the crystal orientation of the surface of the edge part 102.

The protective layer 11 covers the edge part 102 and is configured to prevent defects in the edge part 102 from extending to the middle part 101 during high-temperature processing.

The advantages of the protective layer 11 are: on one hand, the protective layer 11 can prevent a metal source for the epitaxial growth of the III-V compound materials from reacting with the edge part 102 of the silicon substrate 10, so as to reduce the defects of the III-V compound materials in the edge part 102 of the silicon substrate 10; on the other hand, the protective layer 11 can prevent defects in the edge part 102 of the silicon substrate 10 from extending to the middle part 101 of the silicon substrate 10 during high-temperature processing, so as not to cause defects of the III-V compound materials in edge part 102 to extend to the III-V compound materials in the middle part 101, which achieves the purpose of reducing the defects of the III-V compound materials, especially, the defects thereof in the edge part 102.

Figure 5:
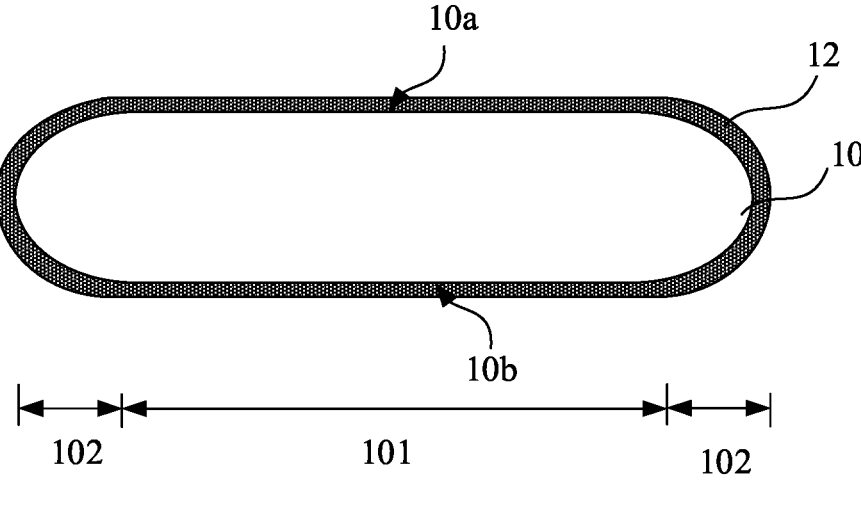
FIGS. 5 and 6 are schematic diagrams illustrating intermediate structures corresponding to a method for manufacturing a substrate according to a second embodiment of the present disclosure.
Figure 6:
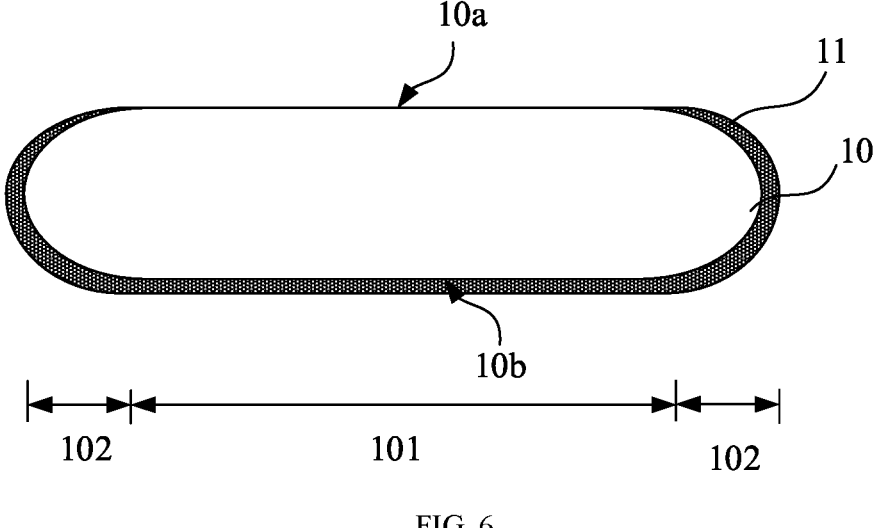

FIGS. 5 and 6 are schematic diagrams illustrating intermediate structures corresponding to a method for manufacturing a substrate according to a second embodiment of the present disclosure. As shown in FIGS. 5 and 6, the method for manufacturing a substrate in this embodiment is roughly the same as that in the first embodiment, except that: in step S1, as shown in FIG. 5, a covering layer 12 is formed through thermal oxidation of the silicon substrate 10. In other words, a material for the covering layer 12 is silicon dioxide.

The thermal oxidation of the silicon substrate 10 may be implemented by placing the silicon substrate 10 in a heating furnace for heating, so as to enable the surfaces of the silicon substrate 10 to be oxidized. Therefore, the covering layer 12 is further formed on the rear surface 10b and a side surface of the silicon substrate 10.

In some embodiments, the covering layer 12 formed on the rear surface 10b and/or the side surface of the silicon substrate 10 may be formed through deposition in the first embodiment. During the deposition, the silicon substrate 10 may be suspended in a deposition chamber by lift pins or in other support manners.

In this embodiment, with reference to FIG. 6, only the covering layer 12 on the to-be-grown surface 10a of the silicon substrate 10 is polished.

Figure 7:
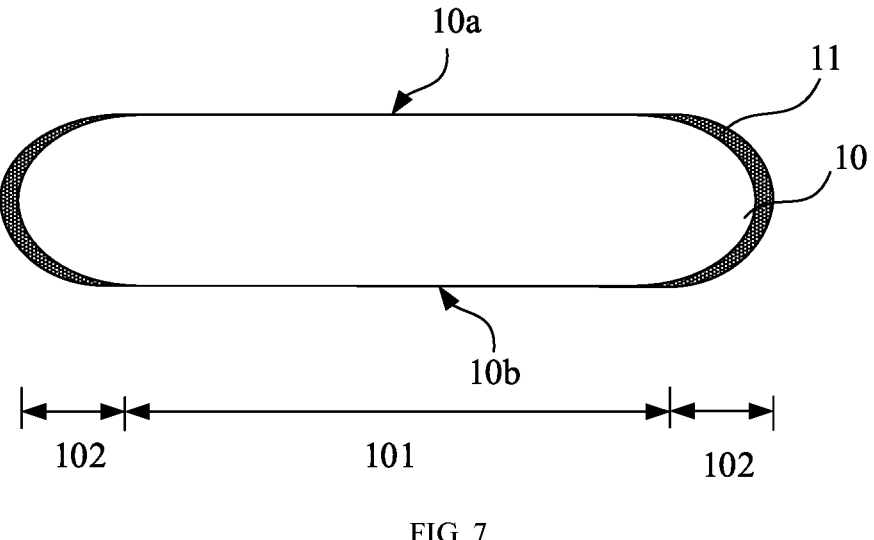
FIG. 7 is a schematic diagram illustrating an intermediate structure corresponding to a method for manufacturing a substrate according to a third embodiment of the present disclosure.

FIG. 7 is a schematic diagram illustrating an intermediate structure corresponding to a method for manufacturing a substrate according to a third embodiment of the present disclosure. As shown in FIG. 7, the method for manufacturing a substrate in this embodiment is roughly the same as that in the second embodiment, except that: in step S2', the covering layer 12 is polished to further expose the rear surface 10b of the silicon substrate 10. In other words, the covering layer 12 on the rear surface 10*b* of the silicon substrate 10 is further polished.

Figure 8:
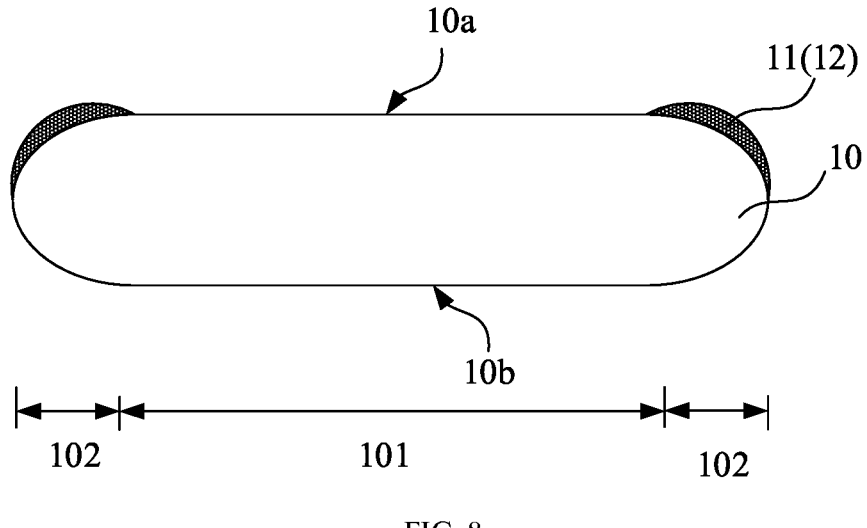
FIG. 8 is a schematic diagram illustrating an intermediate structure corresponding to a method for manufacturing a substrate according to a fourth embodiment of the present disclosure.

FIG. 8 is a schematic diagram illustrating an intermediate structure corresponding to a method for manufacturing a substrate according to a fourth embodiment of the present disclosure. As shown in FIG. 8, the method for manufacturing a substrate in this embodiment is roughly the same as that in the second and third embodiments, except that: a covering layer 12 is formed through local thermal oxidation.

During the local thermal oxidation, a mask layer made of, for example, silicon nitride may be formed in a region where the covering layer 12 does not need to be formed, and subsequently, the mask layer may be removed through wet etching.

Compared with the prior art, the present disclosure has the following beneficial effects:

1) The protective layer covers the edge part of the silicon substrate and is configured to prevent defects in the edge part of the silicon substrate from extending to the middle part of the silicon substrate during high-temperature processing. On one hand, the protective layer can prevent a metal source for the epitaxial growth of the III-V compound materials from reacting with the edge part of the silicon substrate, so as to reduce the defects of the III-V compound materials in the edge part of the silicon substrate. On the other hand, the protective layer can prevent defects in the edge part of the silicon substrate from extending to the middle part of the silicon substrate during high-temperature processing, so as not to cause defects of the III-V compound materials in the edge part to extend to the III-V compound materials in a middle part, which achieves the purpose of reducing the defects of the III-V compound materials, especially, the defects thereof in the edge part.

2) In some optional embodiments, the material for the protective layer includes at least one of silicon dioxide, silicon nitride, aluminum oxide, silicon carbide, silicon oxynitride or aluminum oxynitride. The above materials are stable at high temperatures, and cannot decompose or cause additional defects.

3) In some optional embodiments, the protective layer has a single-layer structure. Compared with a laminated structure, the single-layer structure cannot have the mismatch problem of thermal expansion coefficients of materials, and can reduce the cost.

Although the present disclosure is disclosed as above, it is not limited thereto. Any person skilled in the art may make various changes and modifications without departing from the spirit and scope of the present disclosure. Therefore, the protection scope of the present disclosure shall be based on the scope defined in the claims.

The invention claimed is:

1. A method of manufacturing a substrate, comprising:
providing a silicon substrate comprising a middle part and edge part, wherein a thickness of the middle part is greater than a thickness of the edge part, the middle part has a to-be-grown surface, and a crystal orientation of the to-be-grown surface is different from a crystal orientation of a surface of the edge part;
forming a covering layer on the edge part and the to-be-grown surface; and
polishing the covering layer through chemical mechanical polishing to expose the to-be-grown surface, wherein the covering layer on the edge part after polishing is retained to form a protective layer, and the to-be-grown surface and a polished surface of the protective layer are on a same plane.

2. The method of manufacturing the substrate according to claim 1, wherein the covering layer is further formed on a rear surface of the silicon substrate.

3. The method of manufacturing the substrate according to claim 1, wherein the covering layer is formed through thermal oxidation of the silicon substrate.

4. The method of manufacturing the substrate according to claim 1, wherein the covering layer is formed through deposition comprising: physical vapor deposition, chemical vapor deposition, plasma enhanced chemical vapor deposition, low pressure chemical vapor deposition or atomic layer deposition.

5. The method of manufacturing the substrate according to claim 2, wherein the covering layer is polished to further expose the rear surface of the silicon substrate.

6. The method of manufacturing the substrate according to claim 1, wherein a material for the covering layer comprises at least one of silicon dioxide, silicon nitride, aluminum oxide, silicon carbide, silicon oxynitride or aluminum oxynitride.

7. The method of manufacturing the substrate according to claim 1, wherein the covering layer is formed through local thermal oxidation.

8. The method of manufacturing the substrate according to claim 1, wherein the covering layer has a single-layer structure.

9. The method of manufacturing the substrate according to claim 1, wherein, on a vertical section of the silicon substrate, a side surface of the edge part is convex arc-shaped, step-shaped, trapezoidal, right angled, acute angled or obtuse angled.

10. The method of manufacturing the substrate according to claim 1, wherein the crystal orientation of the to-be-grown surface is [111], and the crystal orientation of the surface of the edge part is [110].

11. A substrate, comprising:
a silicon substrate comprising a middle part and an edge part, wherein a thickness of the middle part is greater than a thickness of the edge part; the middle part has a to-be-grown surface, and a crystal orientation of the to-be-grown surface is different from a crystal orientation of a surface of the edge part; and
a protective layer covering the edge part and configured to prevent defects in the edge part from extending to the middle part during high-temperature processing;
wherein the protective layer is formed through chemical mechanical polishing, and the to-be-grown surface and a polished surface of the protective layer are on a same plane.

12. The substrate according to claim 11, wherein a material for the protective layer comprises at least one of silicon dioxide, silicon nitride, aluminum oxide, silicon carbide, silicon oxynitride or aluminum oxynitride.

13. The substrate according to claim 11, wherein the protective layer has a single-layer structure.

14. The substrate according to claim 11, wherein, on a vertical section of the silicon substrate, a side surface of the edge part is convex arc-shaped, step-shaped, trapezoidal, right angled, acute angled or obtuse angled.

15. The substrate according to claim 11, wherein the crystal orientation of the to-be-grown surface is [111], and the crystal orientation of the surface of the edge part is [110].

* * * * *